United States Patent [19]

Van Tran

[11] Patent Number: 4,649,301

[45] Date of Patent: Mar. 10, 1987

[54] MULTIPLE-INPUT SENSE AMPLIFIER WITH TWO CMOS DIFFERENTIAL STAGES DRIVING A HIGH-GAIN STAGE

[75] Inventor: Hiep Van Tran, Carrollton, Tex.

[73] Assignee: Thomson Components-Mostek Corp., Carrolton, Tex.

[21] Appl. No.: 689,251

[22] Filed: Jan. 7, 1985

[51] Int. Cl.[4] .......................... H03K 5/24; G11C 7/06
[52] U.S. Cl. ................................... 307/530; 365/190; 365/104; 365/208; 307/355; 307/362
[58] Field of Search .............. 307/530, 355, 362, 364, 307/264, 449; 330/253, 264; 365/190, 207, 208, 103, 104

[56] References Cited

U.S. PATENT DOCUMENTS

| | | | |
|---|---|---|---|
| 4,342,004 | 7/1982 | Iida et al. | 330/253 |
| 4,375,619 | 3/1983 | Saari | 330/253 |
| 4,479,202 | 10/1984 | Uchida | 307/530 X |
| 4,504,748 | 3/1985 | Oritani | 307/530 |
| 4,507,759 | 3/1985 | Yasui et al. | 365/208 X |
| 4,539,494 | 9/1985 | Kurafuji | 365/190 X |

OTHER PUBLICATIONS

Chan, "Bit-Select Sense Amplifier"; *IBM-TDB;* vol. 24, No. 11A, pp. 5654-5656; 4/1982.

*Primary Examiner*—Larry N. Anagnos
*Attorney, Agent, or Firm*—Roland Plottel

[57] ABSTRACT

A multiple input differential sense amplifier including a pair of signal inputs and comprising a bank of n-channel MOS transistors for receiving said multiple inputs for connection to one of said signal inputs. The other of said signal inputs can be provided with a fixed bias input, or a complementary input from a complementary bank of n-channel MOS transistors.

5 Claims, 14 Drawing Figures

MULTIPLE-INPUT SENSE AMPLIFIER WITH TWO CMOS DIFFERENTIAL STAGES DRIVING A HIGH-GAIN STAGE

TECHNICAL FIELD

The field of this invention is directed toward the technology of semiconductor memories, in particular CMOS random access memories (RAMs) and read-only memories (ROMs).

BACKGROUND ART

In standard CMOS static RAM bitline and dataline memory read circuitry, the bitline and dataline and their symmetrical complementaries receive a signal indicative of the state of a transistor memory cell. This state information is transferred from the bitline to the dataline through n-channel pass transistors. This state information and its complement are further applied to the inputs of a differential sense amplifier.

This memory scheme is disadvantageously subject to a $V_T$ drop across the bitline, and the sense amplifier is not provided with optimum input voltage levels near the thresholds of the sense amplifier. The standard arrangement is further gain-limited, and it tends substantially to delay a signal passing to the dataline. The speed of signals passing along the signal path is further detrimentally affected by the relatively high capacitance level of the dataline.

SUMMARY OF THE INVENTION

According to the invention, a p-channel transistor bitline is employed to pull up the bitline and eliminate the $V_T$ drop of the bitline, thereby speeding the response time of the circuit. The signal to be passed is additionally transferred from the bitline to the dataline by a p-channel transistor. The gate of this pass device is controlled by a signal from the complement of the column select signal. The dataline pull down n-channel transistor sets the common node voltage of the dataline at a sense amplifier optimum input voltage.

According to another version of the invention a high performance multi-input CMOS differential sense amplifier is constructed with input, differential and high gain stages. The input stage has multiple input devices for the dataline and complementary dataline inputs. The differential stage is a standard CMOS current mirror differential amplifier. The third stage provides both high gain and a high common mode rejection ratio (CMMR).

According to another version of the invention, the CMOS bitline and dataline sensing scheme and the multi-input sense amplifier are adapted for operation with a CMOS ROM. Accordingly, the arrangement is provided with a complementary dataline and a reference voltage level to supply the inputs of the differential sense amplifier with information regarding the states of the ROM memory cell.

DETAILED DESCRIPTION OF A BEST MODE OF THE INVENTION

Figure 1:
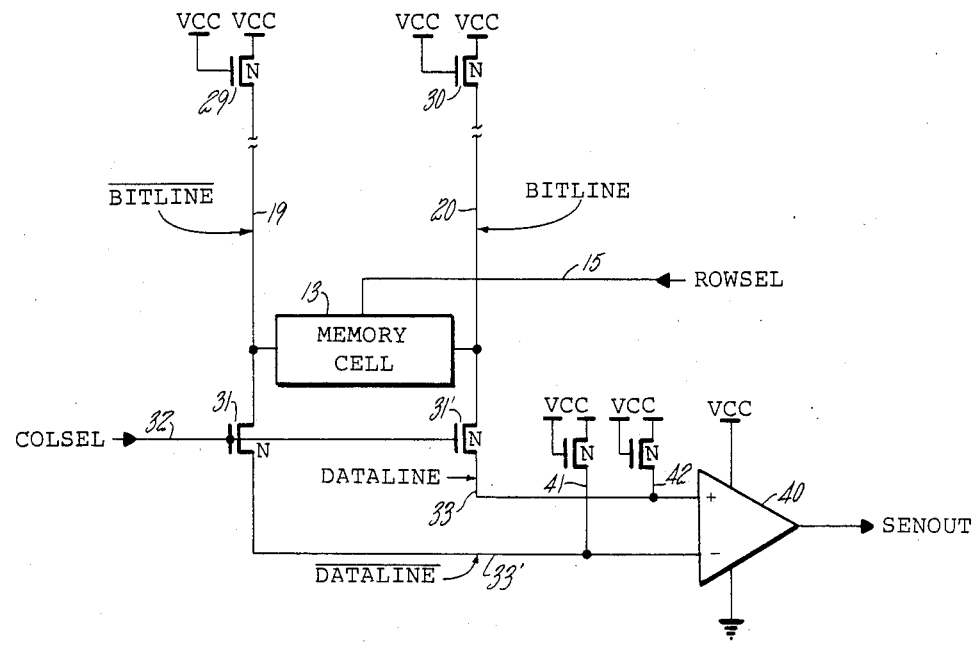
FIG. 1 shows a CMOS bitline and dataline static RAM scheme of the prior art.

FIG. 1 shows a standard CMOS bitline and dataline static RAM scheme which is well known in the art. The scheme shows a memory cell 13 with an input row select line (ROWSEL) 15. The memory cell 13 has bitline and bitline complement input lines, respectively 19 and 20. These lines 19 and 20 are respectively connected to $V_{CC}$ through pull up n-channel transistors 29 and 30 having gate and source connected electrically.

Bitlines 19 and 20 are respectively source connected to n-channel pass transistors 31 and 31'. Column select (COLSEL) line 32 is connected to the gates of respective pass transistors 31 and 31'. At the drain sides of respective pass transistors 31' and 31 are respectively dataline and complementary datalines 33 and 33' connected to the differential inputs of differential sense amplifier 40. These differential inputs are further connected to dataline pull-up transistors respectively 41 and 42.

Figure 2:
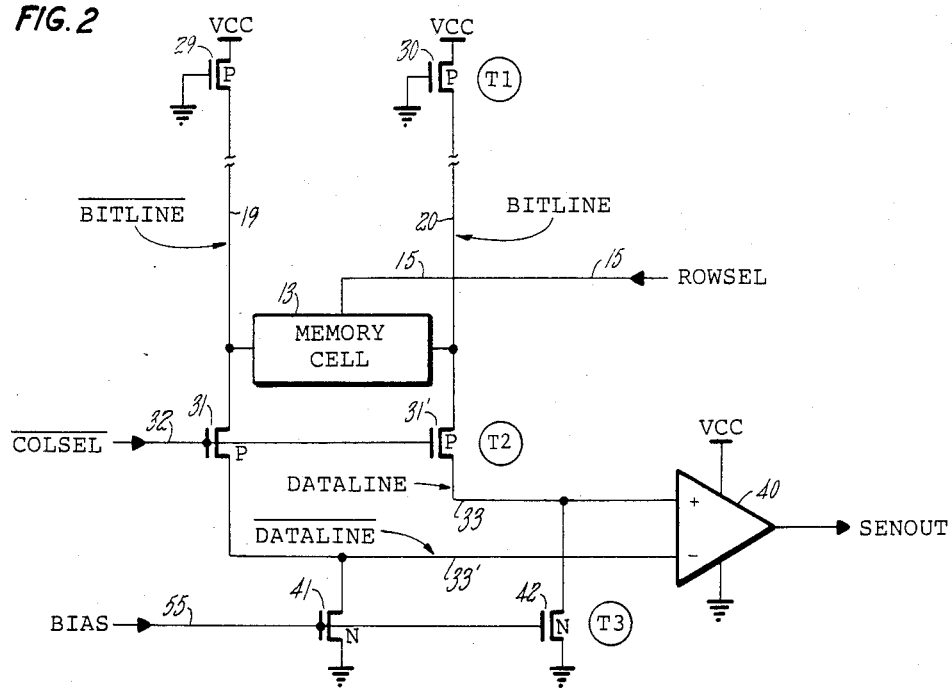
FIG. 2 shows a RAM memory cell including the bitline and dataline scheme of the invention addressed herein.

FIG. 2 exhibits a CMOS bitline and dataline arrangement according to the invention herein. In this case, bitline pull-up transistors 29 and 30 bitlines are p-channel instead of n-channel devices. Further, the pass transistors 31 and 31' are p-channel and driven at their respective gates by the complementary column select line 32. Again respective datalines 33 and 33' drive the differential inputs to differential amplifier 40.

However, the datalines 33 and 33' are provided with n-channel pull-down transistors respectively 42 and 41 which are subject to control at their respective gates by a bias line 55.

Figure 4:
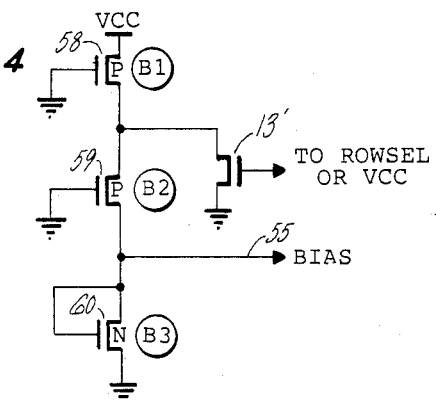
FIG. 4 shows a bias voltage generator circuit effective for supplying the bias level indicated in FIG. 2.

This bias line 55 is generated in accordance with the circuit arrangement shown in FIG. 4. In particular, FIG. 4 shows a p-channel CMOS transistor 58 (B1) connected at its gate to ground and at its source to VCC. The drain of transistor B1 is connected to the source of a p-channel transistor 59 (B2) also having its gate grounded. The node between transistors B1 and B2 is connected to ground through an equivalent one-half memory cell 13' which is gate-driven by signals row select (ROWSEL) or VCC. The drain of transistor B2 is in turn connected to the source and gate of n-transistor 60 (B3).

The arrangement of FIG. 2 eliminates the $V_T$ drop of the bitline, which is an improvement over the prior art in FIG. 1. This is accomplished by the pull-up effect of the p-channel transistor on the bitlines 19 and 20. Further, signal transmission is respectively accomplished from bitlines 19 and 20 to datalines 33' and 33 through respective p-channel pass transistors 31 and 31' as indicated in the FIG. 2. As already noted, the gate of pass transistors 31 and 31' is controlled by a signal from the complement of COLSEL instead of the true COLSEL signal. By employing a pull-down n-channel arrangement of transistors 41 and 42 upon the datalines 33' and 33, the common mode dataline voltage is optimally set in accordance with the input voltage requirements of sense amplifier 40. This voltage level is controlled by the gate voltage of transistors 41 and 42, which is BIAS signal 55.

Pull-up p-channel transistors 29 and 30 operate in the linear region, because their gate-to-source voltages VGS are always greater than their drain to source voltages VDS. Similarly, p-channel pass transistors 31 and 31' are "on", when the complementary COLSEL signal is at ground voltage level.

Figure 3:
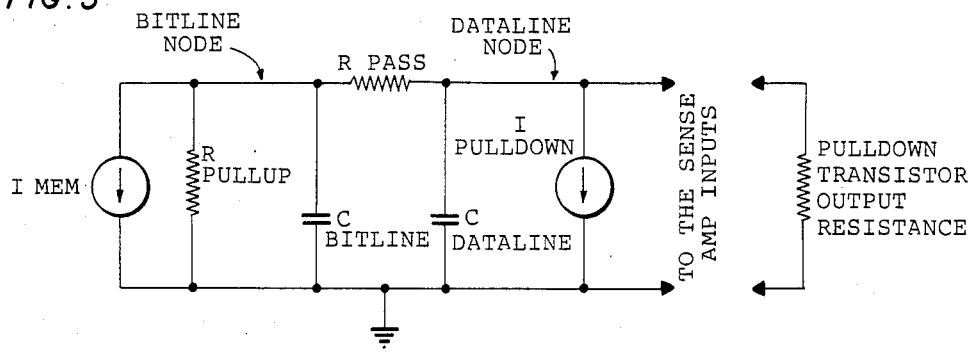
FIG. 3 is a small signal equivalent circuit of the bitline and dataline scheme shown in FIG. 2.

FIG. 3 shows the small-signal equivalent circuit of the arrangement shown in FIG. 2. Only the true bit and datalines are shown, because their complementary lines are the same. Transistors 30 and 31' in this Figure are replaced by equivalent resistances Rpullup and Rpass respectively. Bitline and dataline capacitances are respectively represented by the terms Cbitline and Cdataline. Current from memory cell 13 and current through transistor 42 are replaced by the designations Imem and Ipulldown, respectively. Based upon this equivalent circuit, the dataline node voltage Vdat and be determined as follows:

$$Vdat = Vbit + \frac{Ipulldown}{Kp(Vcc - Vbit - Vtp)}$$

where Vbit is the bitline voltage, Kp is the conduction factor of transistor 31', and Vtp is the p-channel transistor voltage threshold.

By substituting the quantity (Imem+Ipulldown) Rpullup for Vbit in this equation, the following relationship is established:

$$Vdat = \frac{(Imem + Ipulldown) Rpullup + Ipulldown}{Kp(Vcc - (Imem + Ipulldown)Rpullup - Vtp)}$$

The small signal transresistance of the bitline with respect to memory cell current is thus:

*DVbit/dImem = Rpullup*

The small signal transresistance of the dataline with respect to memory cell current can further be determined as follows:

$$\frac{dVdat}{dImem} = Rpullup \left( 1 + \frac{Ipulldown}{Kp(Vcc - Vbit - Vtp)^{**}2} \right)$$

Moreover, the small signal voltage gain of the dataline from the bitline is:

$$\frac{dVdat}{dVbit} = 1 + \frac{Ipulldown}{Kp(Vcc - Vbit - Vtp)^{**}2}$$

This relationship shows that the voltage gain from the bitline to the dataline is always above unity by an amount indicated by the second term, Ipulldown divided by Kp (VCC−Vbit−Vtp)**2. The gain will be greater than unity, when the transistor 42' leaves the linear region and enters saturation. Note that pulldown n-channel transistor 42 is assumed to be operating in the saturation region, and the output resistance of this transistor is high enough to be omitted in the calculation above without affecting the result. For this to be true, the gate voltage of transistor 42 as determined by the BIAS line should be roughly lower or equal to the drain voltage or the dataline common mode voltage.

The common mode input voltage is the equivalent voltage applied to the sense amplifier when the dataline voltage and its complement are equal. Because the dataline and its complement have an equal voltage swing, the common mode voltage in most cases is at the middle of the voltage swing. This voltage can be set by the BIAS line.

As indicated, the bias voltage generator circuit is shown in FIG. 4. This voltage is used to drive each of the gates of the dataline pulldown n-channel transistors 41 and 42.

The voltage level of the BIAS signal is set by the current through pulldown transistor 60 (B3) and the on-resistance of pass transistor 59 (B2) in series with that of pullup transistor 58 (B1) and in parallel with the transistor 13', which produces current equivalent to one half standard memory cell current. The current flow through pulldown transistor 60 is mirrored in the dataline transistor 42, since their respective gates are at the same voltage level.

The dataline voltage is accordingly near the center of the swing range between the dataline maximum and minimum voltages.

The voltage of the BIAS line can be set almost at any level over $V_T$ for a single transistor. This accordingly provides a method to set the common mode input voltage of sense amplifier 40 at an optimum level.

More particularly, because the gate of pulldown transistor 60 is tied to its drain, its Vds is equal to its Vgs and is always greater than the transistor $V_T$ voltage during operation. Thus, the minimum power supply voltage VCC to keep the BIAS voltage above $V_T$ is *VCCmin=- VBIAS+Ipullup (Rpullup)* where VBIAS is a voltage greater than $V_T$, Ipullup is the current flow through the pullup transistor and Rpullup is the equivalent on-resistance of the pullup transistor.

Rpullup is small, because the transistor is biased in the linear region; and the current Ipullup is negligible, because of the low VCC value employed. This makes $VCC_{min}$ roughly equal to the bias voltage, and it can be seen that the common mode input voltage to the sense amplifier is always higher than $V_T$ when VCC is greater than $V_T$. This insures that operation of the entire circuit is possible at a voltage level greater than $V_T$.

Figure 5:
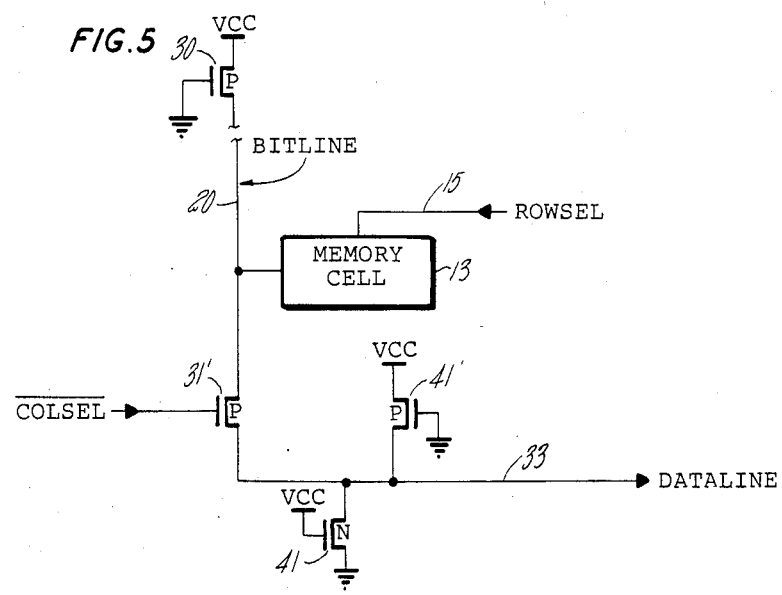
FIG. 5 is a low impedance dataline representation of the arrangement shown in FIG. 2.

It is further desirable to minimize the delay of a signal going through the dataline circuit. The voltage gain of the dataline can be sacrificed for the response speed by increasing the output resistance of the pulldown transistor 42. This can be done by biasing the pulldown transistor 42 to operate in its linear region. The gate voltage of transistor 42 is thus set higher than the dataline voltage or tied to Vcc. In this case, the dataline common mode voltage is set by means of the bitline pullup and dataline pulldown with or without the option of an additional dataline pullup transistor, as shown in the lower impedance dataline scheme of FIG. 5.

Another effective method to speed up the signal path is to reduce the dataline capacitance, which consists of the transistor drain capacitances of all the pass transistors connected to the dataline 33. By cutting down the number of pass devices 31' (or 31) connected to a dataline 33 (or 33'), the delay of the signal through the dataline circuit can be improved.

Figure 6:
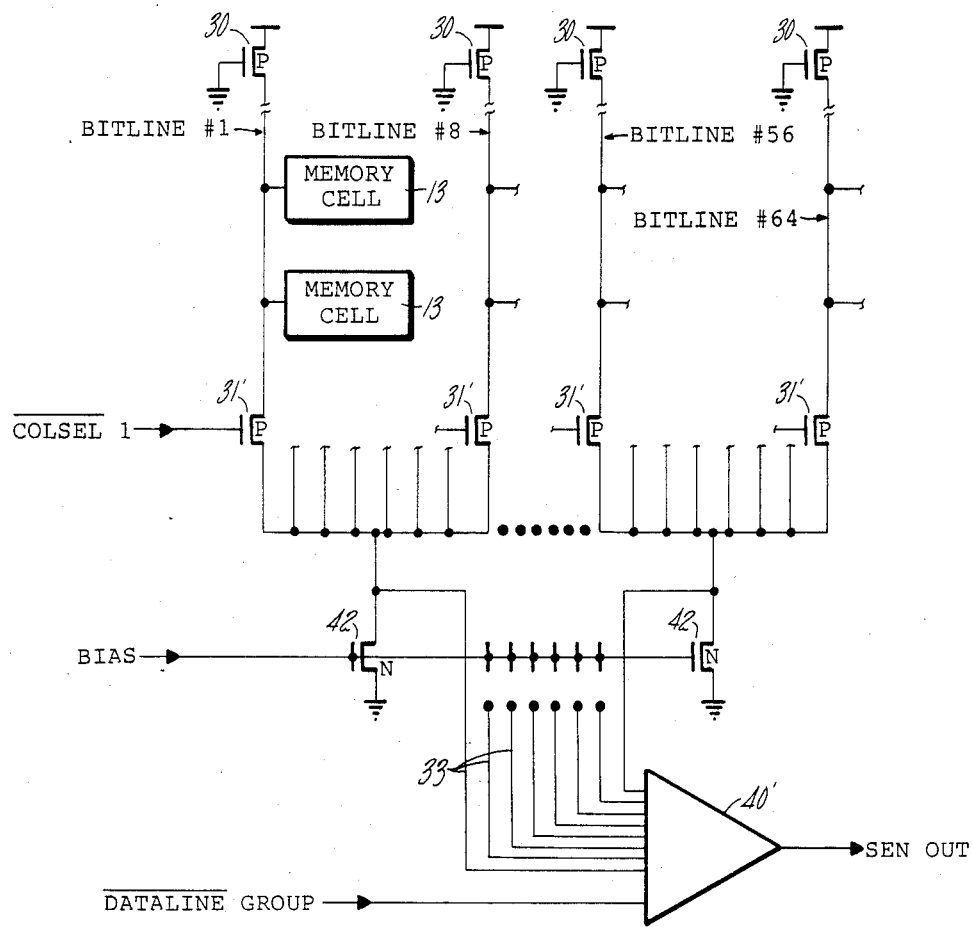
FIG. 6 is an example of how to reduce the dataline capacitance by reducing the number of pass devices connected to a dataline.

According to the invention herein and as suggested in FIG. 6, eight datalines 33 for example are provided each serving only eight pass transistors 31' and only one multiple input sense amplifier 40 is employed. If one of the pass devices 31' is turned "on", the dataline 33 of that entire group will be pulled up to the BIAS voltage level. If none of the eight pass devices 31' are turned on, the datalines 33 of that group will of course remain at Vss and will be pulled down to Vss by a corresponding one of pulldown transistors 42, which have its gate driven by the BIAS line.

Figure 7:
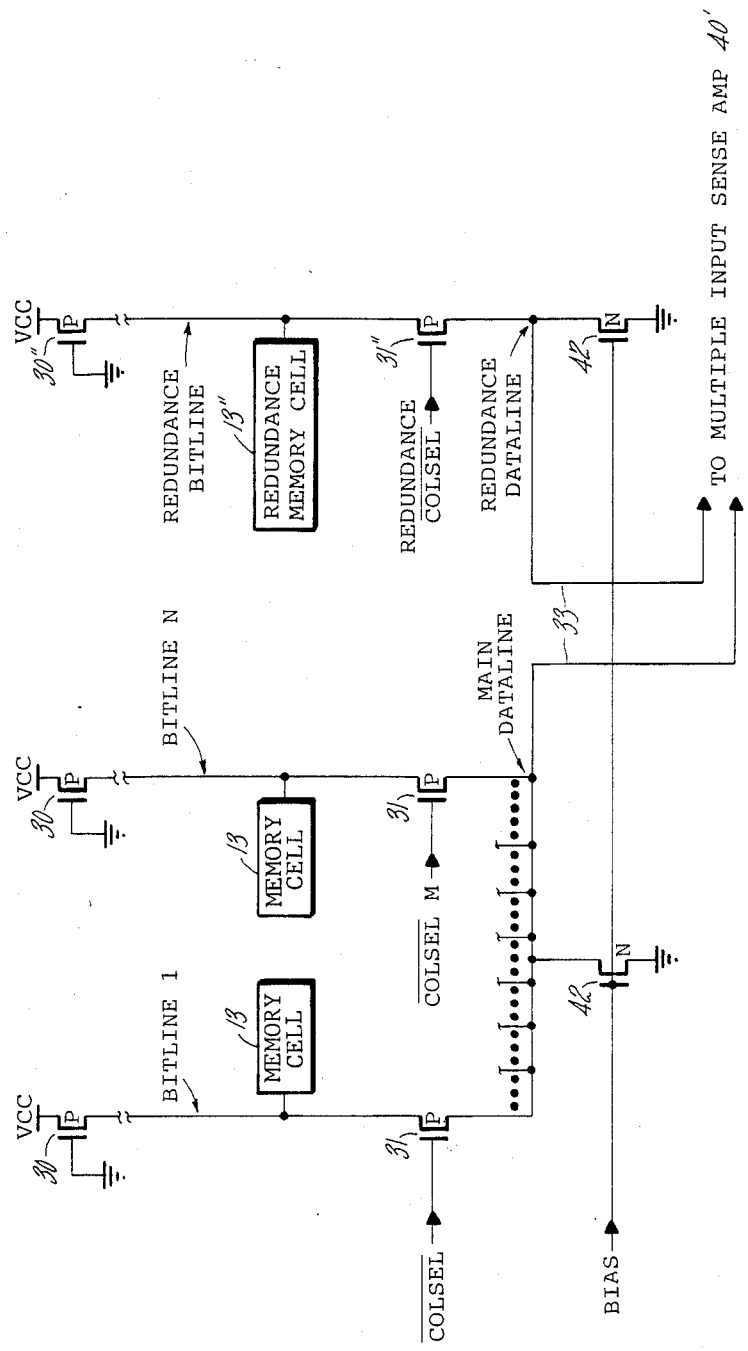
FIG. 7 shows a low capacitance dataline arrangement in which one dataline serves most of the pass transistors and another serves the remaining pass transistors.

The number of pass transistors 31' which a given dataline 33 can serve, can be varied according to the design specification. One dataline 33 can serve, for example, a particular selected number of pass transistors 31', while the remaining datalines serve the pass transistors 31' left over. It can be seen that the remaining pass transistors 31 can carry a group of slow path signals, which can be speeded up by being provided with a low capacitance as suggested by the redundance dataline 33'' in FIG. 7.

The speed of a memory chip is of course no faster than its slowest signal path. The new scheme according to this invention accordingly provides a technique for improving the speed of the slowest signal path in the memory circuit by reducing the number of parallel datalines on the slowest portion of the signal path.

Figure 8:
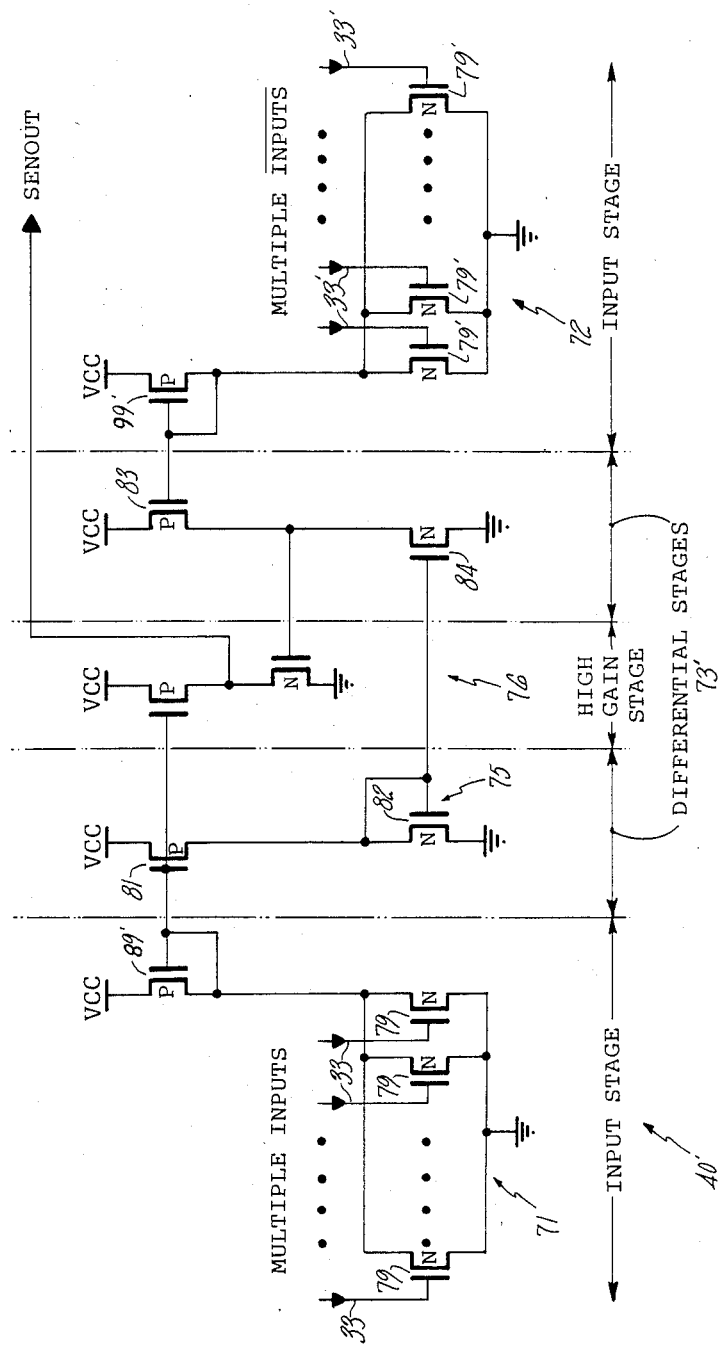
FIG. 8 shows a new high performance multi-input CMOS differential sense amplifier, according to one version of this invention.

According to the invention, a standard differential sense amplifier 40 can clearly be modified to perform as a multi-input sense amplifier 40'. However, the high capacitance created by multiple inputs has a degrading effect upon performance. Accordingly, a multiple-input CMOS differential sense amplifier 41' is proposed according to the invention herein employing three stages as shown in FIG. 8. These stages include first and second input stages 71 and 72 respectively, differential stages 73' and a high gain stage 76. The input stage 71 and 72 each include multiple input devices such as for example n-channel transistors 79 and 79' for the datalines 33 and their respective complement inputs 33'. The low voltage gain of these stages 71 and 72 minimizes the signal delay inherent in the high capacitance which would be caused by a conventional multiple-input sense amplifier 40'.

The differential stages 73' are standard CMOS current mirror differential amplifiers. All differential signals are handled by n-channel transistor current mirrors 75. The high gain stage 76 provides high gain and a high common mode rejection ratio (CMRR) to increase the speed and stability of the arrangement.

The sense amplifier scheme of FIG. 8 can be used in place of a standard differential sense-amplifier arrangement in any circuit of course with multiple-input stages 71 and 72 either removed or modified to provide only a single input pair of inputs such as 33 and 33'.

Figure 9A:
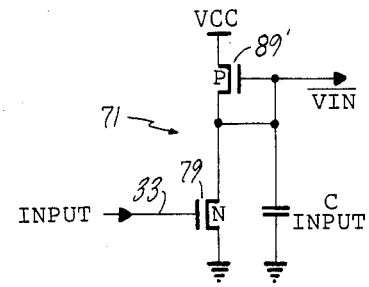
FIGS. 9A and 9B respectively show equivalent circuits of the first and second input stages of the arrangement in FIG. 8.
Figure 9B:
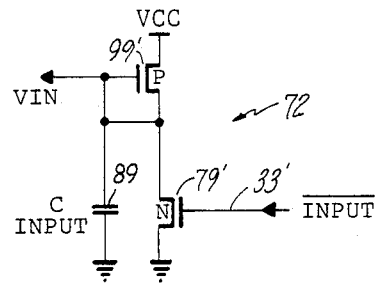

Because only one input-pair 33, 33' of the sense amplifier 40' is turned on at any given time, the respective input stages 71 and 72 can be represented by the respective equivalent circuits shown in FIGS. 9A and 9B.

The input stages 71 and 72 of the sense amplifier 40' are no more than inverters with a p-channel transistor 89', 99' as a load. Since the capacitance of the load is high, a large one of such devices is needed to provide good frequency response and to prevent input n-channel transistors 79 and 79' from getting into a linear operational mode under the influence of high input common mode voltages.

Note that the two input stages 71 and 72 are equivalent in structure. The differential stage 73' and the high-gain stage are shown in detail in FIG. 10. All of the p-channel transistors are identical, as are the n-channel transistors in the Figure.

Figure 10:
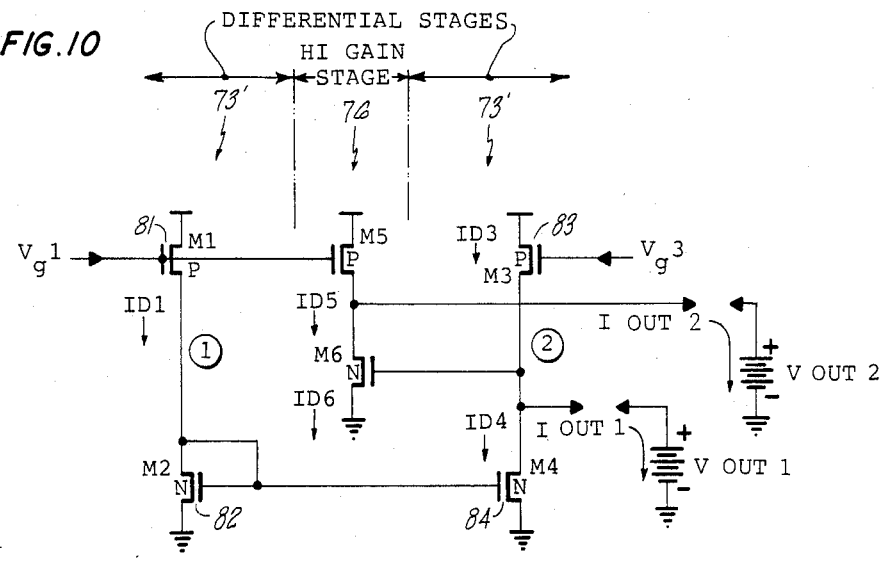
FIG. 10 shows the differential and high gain stages of the arrangement shown in FIG. 8.

Transistors 81, 82, 83 and 84 (respectively M1, M2, M3 and M4) are treated as being in saturation and the DC output current at node 2 in FIG. 10 is considered to be flowing to a fixed DC voltage output source VOUT1. Under these conditions, the following relationship holds true: IOUT1=ID3−ID4; where ID1, ID2, ID3 and ID4 are the respective drain currents from respective transistors M1, M2, M3 and M4. Since ID4 equals ID2, and ID2 equals ID1; IOUT1 equals ID1−ID3, and ID1 equals Kp(Vg1−Vtp)2, where Vg1, Vg2, Vg3 and Vg4 are the gate-source voltage of transistors M1, M2, M3 and M4 respectively, and Kp is the transconductance factor of a p-channel transistor. Thus, ID3 equals Kp(Vg3−Vtp)2; IOUT1=kp[(Vg1−Vtp)2−(Vg3−Vtp)2]; IOUT1=kp(Vg12−2Vg1Vtp−Vg32+2Vg3Vtp).

By setting Vg1=Vcom+v, and Vg3=Vcom−v, where Vcom is the common mode voltage, the following relationship results: IOUT1=kp[(Vcom+v)2−(-Vcom−v)2−2Vtp(Vcom+v)+2Vtp(Vcom−v)]. This reduces to: IOUT1=4kp v(Vcom−Vtp). By setting ½Vdif=v; where Vdif=Vg1−Vg3, IOUT1 will equal V2 Vdif[kp(Vcom−Vtp)].

This equation indicates that the DC current IOUT1 is a function of the differential voltage between Vg1 and Vg3. It also shows the output is capable of source and sink currents depending on the sign of Vdif. The transconductance gmd of this stage is accordingly:

$$gmd = \frac{dIOUT1}{dVdif} = 2kp(Vcom - Vtp)$$

Accordingly, IOUT1 can be expressed as: *IOUT1=(-Vdif)(gm,* of a p-channel transistor).

The DC output current IOUT2 of the high gain stage 76 is: IOUT2=ID5−ID6. Further, OPIT2=Kp(Vg5−Vtp)2−Kn(Vg6−Vtn)2, where Kn is the transconductance factor of an n-channel transistor. By setting Vg5=Vcom−v and setting Vg6=V1+Av, where A is the voltage gain of the previous differential stage, IOUT2=Kp(-Vcom−v−Vtp)2−Kn(V1+Av=Vtn)2. Thus, the transconductance of this high gain stage "gmh" follows the relationship:

$$gmh = \frac{d(IOUT2)}{d(v)} =$$

$$-2kp(Vcom - v - Vtp) - 2Akn(V1 + Av - Vtn).$$

Further, $$gmh = 2kp(Vg5 - Vtp) + 2Akn(Vg6 - Vtn);$$

and $$gmh = (gm \text{ p-channel}) + A(gm \text{ n-channel}).$$

IOUT2 can thus be expressed as: $IOUT2 = [Vdif/2][gm \text{ p-channel} + A(gm \text{ n-channel})]$.

Figure 11:
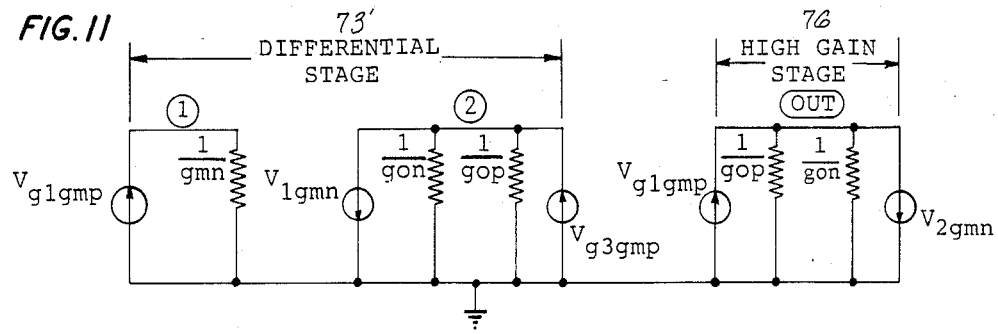
FIG. 11 is a small signal equivalent circuit of the amplification stages of the arrangement in FIG. 8.

The small signal equivalent circuit of both amplification stages is shown in FIG. 11. According to this circuit, the node voltage can be calculated as follows; with the transconductances of the p- and n-channel transistors being referred to as gmp and gmn, and the respective output conductances being gop and gon Thus, $$V1 = \frac{Vin \; gmp}{gmn + gop + gon}$$

Assuming that all transistors are operated in the saturation region, gm will be much greater than go, and:

$$V1 = \frac{(Vin)(gmp)}{gmn}$$

Further, $$V2 = \frac{(V1)(gmn) - (Vref)(gmp)}{gop + gon}$$

By substitution, it follows that:

$$V2 = \frac{Vin \; gmp \; gmn}{gmn \; (gop + gon)} - \frac{Vref \; gmp}{gop + gon};$$

$$V2 = \frac{(Vin - Vref) \; gmp}{gop + gon};$$

and finally $$V2 = Vdif \, [gmp(Rout \text{ p-channel} // Rout \text{ n-channel})].$$

The current output $IOUT1$ follows the relationship:

$$IOUT1 = V2/Rout = (Vdif)(gm \text{ p-channel})$$

Thus, the voltage gain of the differential stage is:

$$GAIN1 = V2/Vdif = (gmp)(Rout)$$

The voltage output of the high gain stage "VOUT" is:

$$VOUT = \frac{(Vin)(gmp) + (V2)(gmn)}{gop + gon}.$$

Thus:

$$VOUT = [(Vin)(gmp) + (GAIN1)(Vin)(gmn)][(Rout \text{ p-channel} // (Rout \text{ n-channel})];$$

and $$VOUT = Vin \, (gmp + GAIN1 \, gmn)(Rout).$$

Further, IOUT2 can be calculated accordingly:

$$IOUT2 = VOUT/Rout = VDIF/2[gmp + GAIN1(gmn)]$$

The voltage gain of the high gain stage is:

$$GAIN2 = VOUT/Vin = [(gmp) + (GAIN1)(gmn)]Rout$$

Further, $$GAIN2 = [(gmp) + (gmp)(gmn)(Rout)](Rout)$$

By choosing transistor size so the gmp=gmn, it follows that:

$$GAIN2 = GAIN1 + GAIN1**2$$

The voltage gain of the high gain stage is thus very large even with low output resistance and transistor transconductance. The common mode output voltage of the two output nodes V2 and VOUT is equal to V1, because all n-channel transistors have the same Vgs in the common mode. This is also true with the p-channel transistors.

The common mode gain (Acom) is:

$$Acom = V1/Vin = gmp/gmn$$

The common mode rejection ratio of the differential stage (CMRR1) is:

$$CMRR1 = GAIN1/Acom = (gmn)(Rout)$$

The common mode rejection ratio of the high gain stage (CMRR2) follows the relationships:

$$CMRR2 = GAIN2/Acom = (gmn)(Rout) + (gmn \; Rout)**2$$

Figure 12:
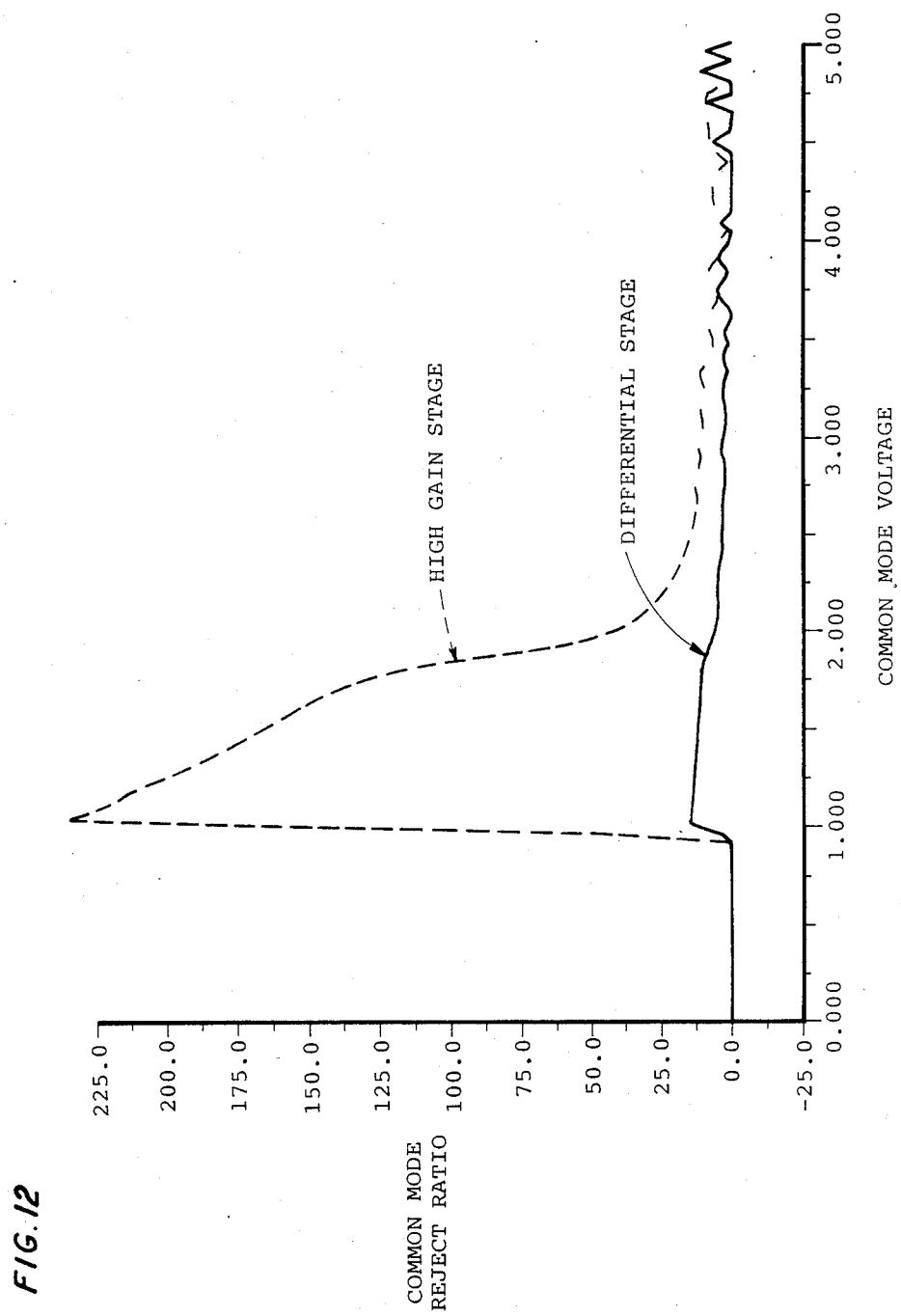
FIG. 12 shows a plot of the common mode rejection ratios (CMMR's) of the differential and high gain stages of the arrangement versus the common mode input voltage of the sense amplifier.

Comparing the common mode ratios shows that a high gain stage has increased the common mode rejection ratio by more than the square of the differential stage rejection ratio. FIG. 12 shows this relationship by plotting the CMRR versus common mode input voltages of the sense amplifier.

Figure 13:
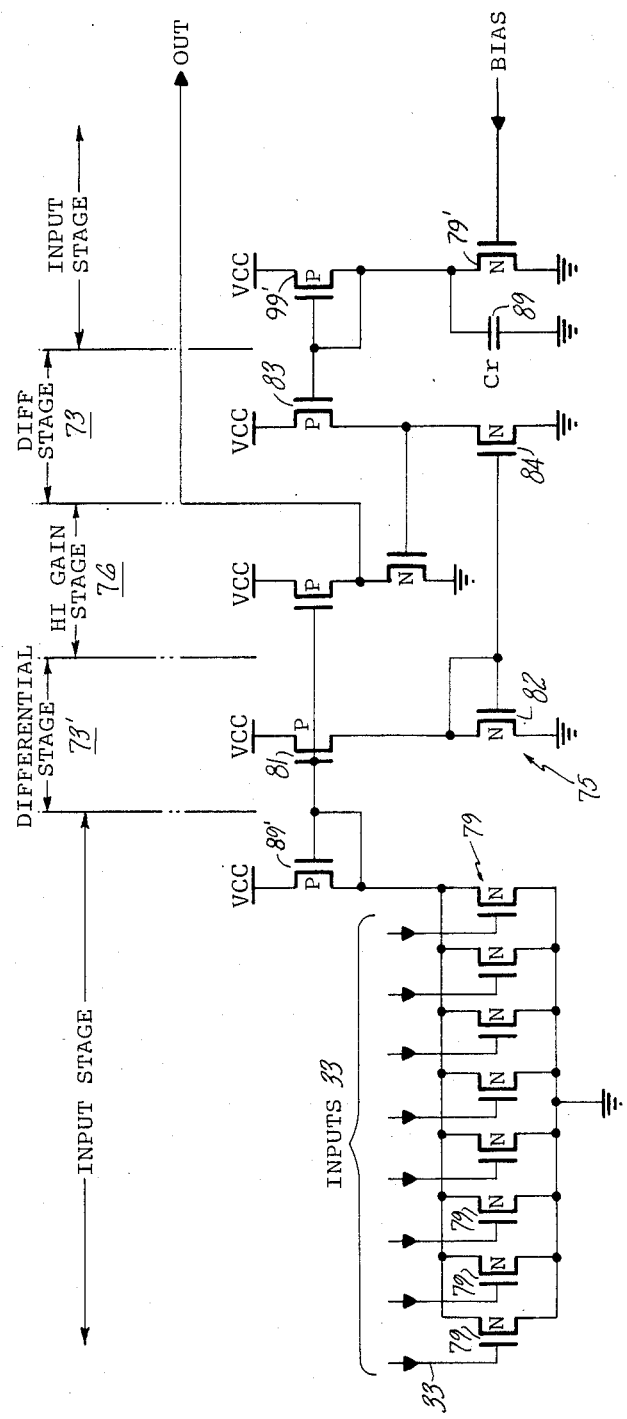
FIG. 13 shows a modified multi-input sense amplifier suitable for use in a CMOS ROM.

The CMOS bitline and dataline sensing scheme according to this invention and the multi-input sense amplifier described above can also be successfully used in a CMOS ROM as suggested in FIG. 13.

The bitline and dataline in this ROM arrangement are essentially identical to the one described earlier with respect to a static RAM memory array. However, because ROM memory circuits lack a complementary dataline for connection to one side of a differential sense amplifier, a reference voltage level is needed for the sense amplifier to differentiate the two stages of the memory cell. The BIAS voltage level in FIG. 13 is accordingly set at the middle of the maximum voltage swing of the dataline as shown in FIG. 4. Capacitor 89 is added to the reference input side to minimize input-stage capacitance loading mismatch, thus reducing the effect of noise from the power supply.

The information above may lead others to conceive of other versions of the invention, which nonetheless fall within the scope of the invention. Accordingly, reference to the claims which follow is urged, as these express the range of the metes and bounds with particularity.

I claim:

1. A multiple input sense amplifier arrangement, for a CMOS memory, comprising
   a differential sense amplifier means (73') responsive to complementary input signals at its inputs provided by respective input stages (71, 72) receiving input signals (33) and complementary input signals (33'), wherein each of said respective input stages (71, 72) includes a plurality of input-gate-driven n-channel MOS transistors (79, 79') corresponding to the number of multiple inputs to said sense amplifier arrangement, and a p-channel MOS transistor (89', 99') connected at its source to a power supply potential (VCC) and connected at its drain and gate to an input transistor (81,83) of said differential sense amplifier means (73') and directly to the drains of said plurality of n-channel MOS transistors (79, 79').

2. The arrangement of claim 1, characterized by each of said input stages further comprising a plurality of the same number of input gate driven n-channel MOS transistors, and a respective p-channel MOS transistor connected by its source to VCC, and connected at its gate and drain to a respective input of said differential sense amplifier means and to the drains of said plurality of n-channel MOS transistors.

3. The arrangement of claim 1, wherein said differential sense amplifier means includes a high gain stage.

4. A multiple input sense amplifier arrangement, for a CMOS memory, comprising a differential sense amplifier means (73') responsive to complementary input signals provided by first and second input stages (71, 72) receiving input signals (33) and a reference signal providing a selected bias voltage level, respectively, wherein the respective input stages (71, 72) includes for the first input stage a plurality of input-gate-driven n-channel MOS transistors (79) corresponding to the number of multiple inputs to said sense amplifier arrangement, and a p-channel MOS transistor (89') connected at its source to a power supply potential (VCC) and connected at its drain and gate to an input transistor (81) of said differential sense amplifier means (73') and to the drains of said plurality of n-channel MOS transistors (79), and for the second input stage wherein the complementary input signal to said differential sense amplifier means (73') is provided, there is included a gate-to-drain-connected p-channel MOS transistor (99') having a source connected to VCC and a gate and drain connected to the drain of an n-channel MOS transistor (79') having a source connected to ground and driven at its gate by said selected bias voltage level.

5. The arrangement of claim 4, wherein the drains of said MOS transistors (79', 99'), connected in common for providing the complementary input signals, are connected to ground through a capacitor (89) sized in order to match the capacitance of the second input stage (72) of which it forms a part to the capacitance of the first input stage (71) of said sense amplifier (73').

* * * * *